United States Patent
Tsurumaki (10) Patent No.: US 9,589,766 B2
(45) Date of Patent: Mar. 7, 2017

(54) APPARATUS AND METHOD FOR CALCULATING DRAWING SPEEDS OF A CHARGED PARTICLE BEAM

(71) Applicant: NuFlare Technology, Inc., Yokohama-shi (JP)

(72) Inventor: Hideyuki Tsurumaki, Yokohami (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 14/717,444

(22) Filed: May 20, 2015

(65) Prior Publication Data
US 2015/0380213 A1 Dec. 31, 2015

(30) Foreign Application Priority Data
Jun. 26, 2014 (JP) .................. 2014-131516

(51) Int. Cl.
*H01J 37/317* (2006.01)
*H01J 37/302* (2006.01)

(52) U.S. Cl.
CPC ...... *H01J 37/3174* (2013.01); *H01J 37/3023* (2013.01); *H01J 2237/20285* (2013.01);
(Continued)

(58) Field of Classification Search
CPC . H01J 37/3174; H01J 37/3175; H01J 37/3177
(Continued)

(56) References Cited

U.S. PATENT DOCUMENTS

2002/0085192 A1* 7/2002 Miura .................. B82Y 10/00
355/73
2006/0289805 A1* 12/2006 Nakasugi ............ H01J 37/3026
250/492.23
(Continued)

FOREIGN PATENT DOCUMENTS

JP 10-284387 10/1998
JP 2000-021747 1/2000
(Continued)

OTHER PUBLICATIONS

Office Action issued Jul. 21, 2016 in Taiwanese Patent Application No. 104116968.
(Continued)

*Primary Examiner* — Jason McCormack
(74) *Attorney, Agent, or Firm* — Oblon, McClelland, Maier & Neustadt, L.L.P.

(57) ABSTRACT

A charged particle beam drawing apparatus has a drawing unit that directs a charged particle beam and draws a pattern on a target and also has a control calculator that controls the drawing unit. The control calculator has a speed calculating unit configured to calculate a first drawing speed in a first area in a drawing area on the target according to a run-up start coordinate, a drawing start coordinate, and a predetermined first acceleration, and calculate the range of the first area according to the run-up start coordinate, the first acceleration, and a second drawing speed, and also has a drawing control unit configured to control the drawing unit so that, in the first area, drawing is performed at the first drawing speed and, in a second area that follows the first area, drawing is performed at the second drawing speed.

14 Claims, 10 Drawing Sheets

(52) U.S. Cl.
CPC ............ *H01J 2237/31766* (2013.01); *H01J 2237/31776* (2013.01)

(58) Field of Classification Search
USPC ............................... 250/492.1, 492.2, 492.3
See application file for complete search history.

(56) References Cited

U.S. PATENT DOCUMENTS

| | | | | |
|---|---|---|---|---|
| 2008/0001097 A1* | 1/2008 | Nakasugi | ............... | B82Y 10/00 250/398 |
| 2009/0032738 A1* | 2/2009 | Takekoshi | .............. | B82Y 10/00 250/492.22 |

FOREIGN PATENT DOCUMENTS

| | | |
|---|---|---|
| JP | 3466985 | 11/2003 |
| JP | 2009-038055 | 2/2009 |
| KR | 10-2010-0004881 | 1/2010 |

OTHER PUBLICATIONS

Office Action issued Aug. 31, 2016 in Korean Patent Application No. 10-2015-0088982.

\* cited by examiner

APPARATUS AND METHOD FOR CALCULATING DRAWING SPEEDS OF A CHARGED PARTICLE BEAM

CROSS REFERENCE TO RELATED APPLICATION

This application is based upon and claims the benefit of priority from the prior Japanese Patent Application No. 2014-131516 filed on Jun. 26, 2014, the entire contents of which are incorporated herein by reference.

FIELD

The present invention relates to a charged particle beam drawing apparatus and a charged particle beam drawing method.

BACKGROUND

Along with high integration of LSI, circuit line widths demanded for semiconductor devices are being reduced year after year. To form desired circuit patterns in these semiconductor devices, a highly precise original pattern (also referred to as a reticle or mask) is needed. To produce a highly precise original pattern, electronic beam lithography technology using an electronic beam drawing apparatus is used.

With an electronic beam drawing apparatus, a drawing area is divided into strip-like stripes; by using these stripes as drawing units, an electronic beam is emitted while a stage on which a target such as a mask is placed is moved so that a pattern is drawn on the target. As drawing methods, variable-speed drawing, in which the stage speed is varied depending on the pattern density, and constant-speed drawing, in which the stage is moved at constant speed, are known.

In constant-speed drawing, the stage is accelerated at predetermined acceleration; after the stage speed has reached a target speed, drawing starts. If the drawing pattern is positioned at an end of the target, a run-up start coordinate for drawing this pattern at the target speed may exceed a limit coordinate. That is, there may be a case in which a run-up distance cannot be assured. In this case, a limit error has been avoided by reducing the target speed to shorten a distance needed for run-up.

Similarly, if the stage is decelerated at predetermined acceleration after a pattern has been drawn in one stripe, a stage stop position may exceed a limit coordinate. That is, there may be a case in which a stop distance cannot be assured. In this case as well, a limit error has been avoided by reducing the target speed to shorten the stop distance.

However, if constant drawing is performed at reduced target speed to avoid a limit error, there has been the problem that since drawing is performed by reducing the speed in the entire stripe area, throughput is dropped.

DETAILED DESCRIPTION

In one embodiment, a charged particle beam drawing apparatus comprises a drawing unit that draws a pattern by directing a charged particle beam to a predetermined position on a target placed on a movable stage, and a control unit that includes a control calculator that controls the drawing unit. The control calculator comprises a speed calculating unit that calculates a first drawing speed in a first area in a drawing area on the target based on a run-up start coordinate, a drawing start coordinate, and a predetermined first acceleration, and calculates a range of the first area based on the run-up start coordinate, the first acceleration, and a second drawing speed, which is higher than the first drawing speed, and a drawing control unit that controls the drawing unit to perform drawing at the first drawing speed in the first area, and to perform drawing at the second drawing speed in a second area that follows the first area.

An embodiment of the present invention will be described below according to the drawings.

Figure 1:
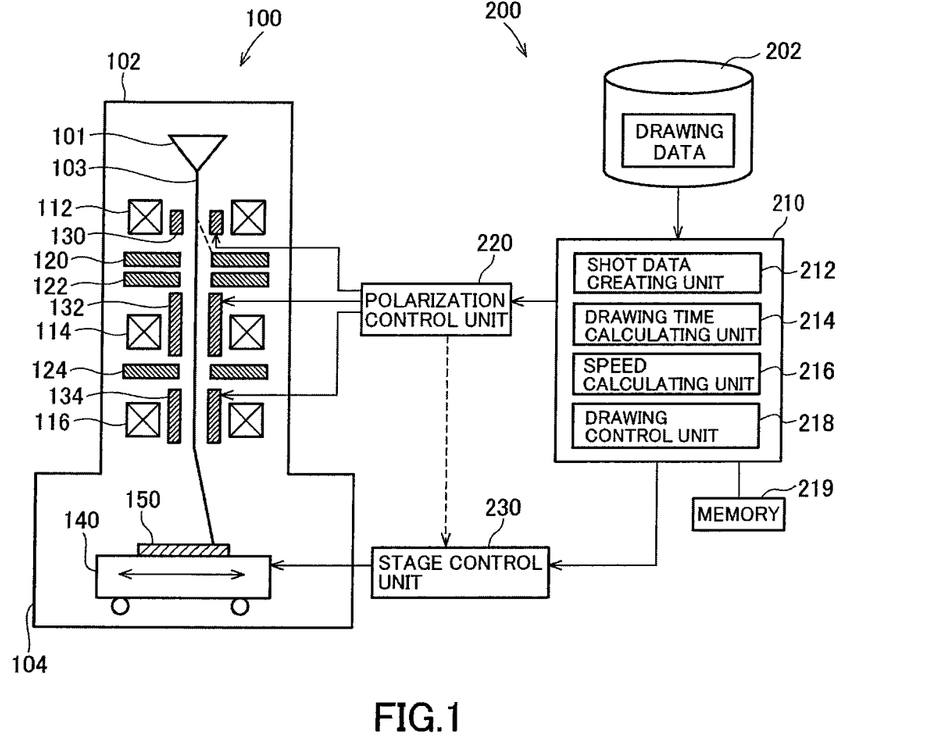
FIG. 1 is a schematic drawing of a charged particle beam drawing apparatus according an embodiment of the present invention.

FIG. 1 is a schematic drawing of a charged particle beam drawing apparatus according an embodiment of the present invention. In this embodiment, as an example of a charged particle beam drawing apparatus, a structure in which an electronic beam is used will be described. However, a charged particle beam is not limited to an electronic beam; a beam using other charged particles such as an ion beam may be used.

The drawing apparatus illustrated in FIG. 1 has a drawing unit 100 that draws a desired pattern by directing an electronic beam to a target such as a mask or wafer and a control unit 200 that controls drawing operation by the drawing unit 100. The drawing unit 100 has an electronic beam lens-barrel 102 and a drawing chamber 104.

In the electronic beam lens-barrel 102, an electron gun 101, an illumination lens 112, a projection lens 114, an objective lens 116, a blanking aperture 120, a first aperture 122, a second aperture 124, and polarizers 130, 132, and 134 are placed. In the drawing chamber 104, an XY stage 140 is movably placed. A mask 150, which is a target, is placed on the XY stage 140. As the target, a wafer and a mask for exposure by which a pattern is transferred to the wafer, for example, are included. The mask includes, for example, a mask blanks on which a pattern has not been yet formed.

An electronic beam 103 emitted from the electron gun 101 illuminates the whole of the first aperture 122, which has a rectangular hole, through the illumination lens 112. Here, the electronic beam 103 is formed in a rectangular shape. The electronic beam 103 in a first aperture image, which has passed through the first aperture 122, is projected on the second aperture 124 through the projection lens 114. The position of the first aperture image on the second aperture 124 is polarization controlled by the polarizer 132, enabling the beam shape and size to be changed. The electronic beam 103 in a second aperture image, which has passed through the second aperture 124, is focused by the objective lens 116, polarized by the polarizer 134, and directed to a desired position on the mask 150 on the XY stage 140, which continuously moves.

The electronic beam 103 emitted from the electron gun 101 is controlled by the polarizer 130 so that, in a beam-on state, the electronic beam 103 passes through the blanking aperture 120 and, in a beam-off state, the electronic beam 103 is polarized so that the entire beam is shielded by the blanking aperture 120. An electron beam that has passed through the blanking aperture 120 from when the beam-off state is changed to the beam-on state until the beam-off state is entered is one electronic beam shot. The amount of illumination per shot of an electronic beam directed to the mask 150 is adjusted by illumination time in each shot.

Figure 2:
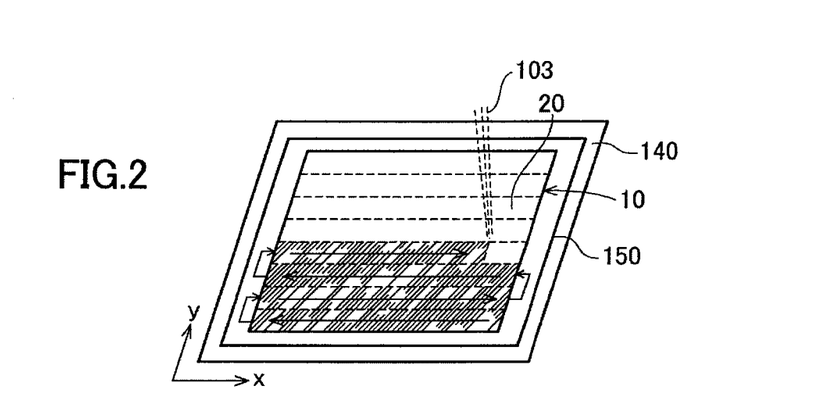
FIG. 2 is a drawing illustrating an example of stage movement.

FIG. 2 is a drawing illustrating an example of stage movement during pattern drawing. When drawing is performed on the mask 150, a drawing area 10 is virtually divided into a plurality of strip-like stripes (frames) 20 with a width within which the electronic beam 103 can be polarized and one stripe 20 on the mask 150 is illuminated with the electronic beam 103 while the XY stage 140 is moved in, for example, the x direction. Movement of the XY stage 140 in the x direction is continuous movement, and, at the same time, the polarizer 134 causes the shot position of the electronic beam 103 to follow the stage movement. Since the XY stage 140 is continuously moved, drawing time can be shortened. Upon the termination of the drawing in one stripe 20, the XY stage 140 is step-fed in the y direction and drawing operation is performed in a next stripe 20 in the x direction (reverse direction).

Figure 3:
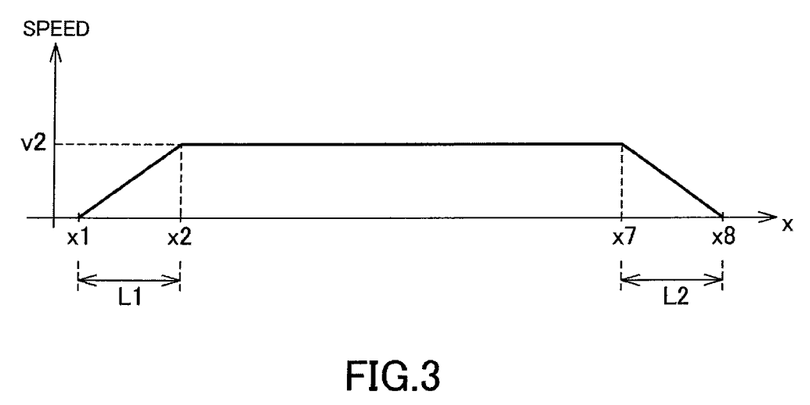
FIG. 3 is a graph illustrating an example of changes in drawing speed in constant drawing.

The drawing apparatus according to this embodiment performs constant-speed drawing, in which the stage is moved at constant speed during drawing. FIG. 3 illustrates an example of changes in drawing speed (stage speed) when constant-speed drawing is performed. In FIG. 3, the horizontal axis indicates positions (coordinates) in the x direction, and the vertical axis indicates drawing speed. In constant-speed drawing, acceleration starts at run-up start coordinate x1 at predetermined acceleration a1. When predetermined speed (target speed) v2 is reached at drawing start coordinate x2, pattern drawing starts. The method of obtaining predetermined speed v2 will be described later. After that, drawing is performed at constant speed v2. When the drawing of the last pattern in this stripe is terminated at drawing termination coordinate x7, deceleration is performed at predetermined acceleration a2 and stage movement is stopped at stop coordinate x8. Accelerations a1 and a2 are each a predetermined value. The absolute value of acceleration a1 and the absolute value of acceleration a2 may be the same or may be different.

Figure 4:
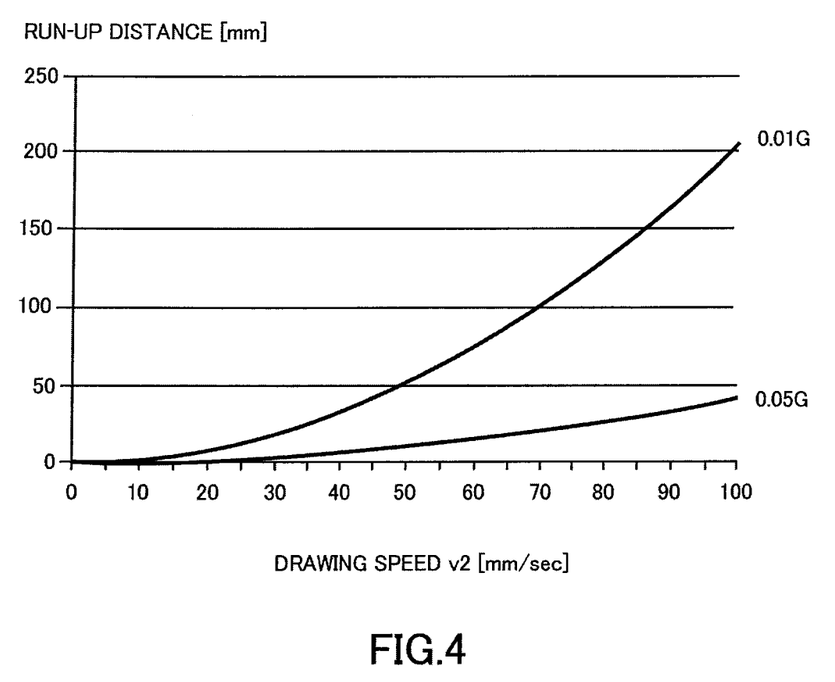
FIG. 4 is a graph illustrating a relationship between drawing speed and run-up distance.

Run-up distance L1 needed from when acceleration (run-up) is started until predetermined speed v2 is reached is determined from acceleration a1 and speed v2. Stop distance L2 needed from when deceleration is started until the XY stage 140 is stopped is determined from acceleration a2 and speed v2. FIG. 4 is a graph indicating a relationship between speed v2 and necessary run-up distance L1 when acceleration a1 is set to 0.01 G (G=9800000 [μm/sec$^2$] and 0.05 G.

Figure 5A:
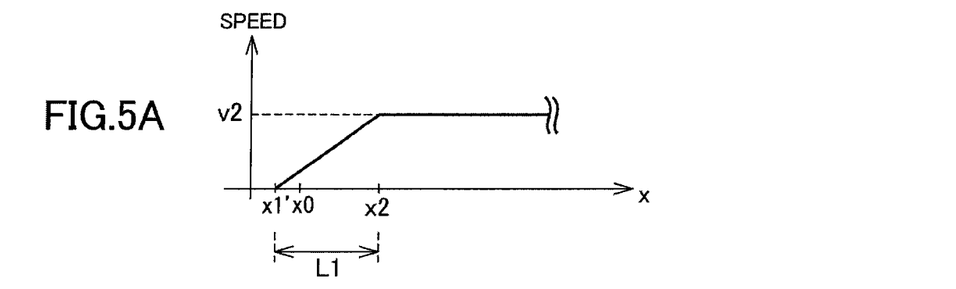
FIG. 5A is a graph illustrating an example in which run-up distance is insufficient.

Here, when a drawing pattern is positioned at the end of the mask 150 on the start point side (run-up start side), run-up start coordinate x1' may exceed limit coordinate x0 (limit point predetermined according to the structure of the XY stage 140 and the like), as illustrated in FIG. 5A. That is, if drawing start coordinate x2 is close to limit coordinate x0, there may be a case in which run-up distance L1 needed to reach predetermined speed v2 cannot be assured.

Figure 5B:
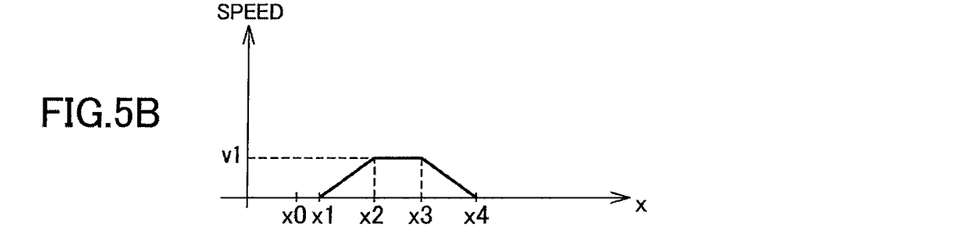
FIGS. 5B, 5C, and 5D are graphs illustrating drawing speed control according to the embodiment.

In this case, in this embodiment, acceleration is first started from run-up start coordinate x1 that does not exceed limit coordinate x0 at the predetermined acceleration a1 and pattern drawing is then started at speed v1, which is lower than predetermined speed v2, at drawing start coordinate x2, as illustrated in FIG. 5B. After that, drawing is performed at constant speed v1, pattern drawing is temporarily stopped at coordinate x3, and stage movement is decelerated at predetermined acceleration a2 and is stopped at coordinate x4. The distance between coordinate x1 and coordinate x3 is almost the same as run-up distance L1.

Figure 5C:
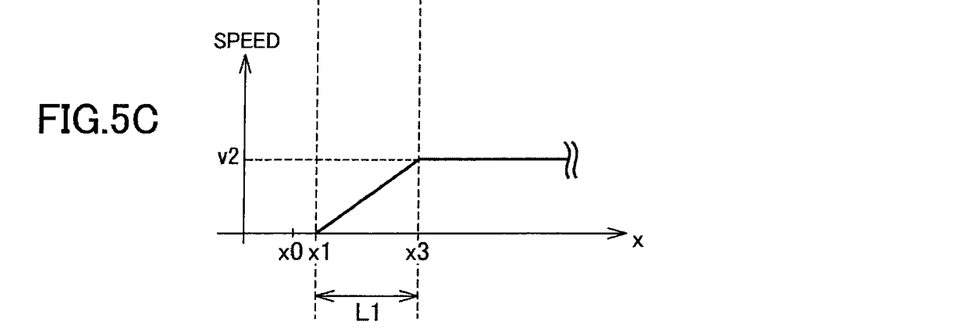
Figure 5D:
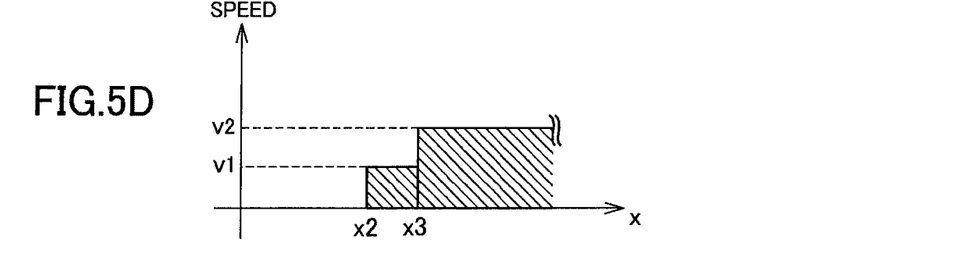

Returning from coordinate x4 to run-up start coordinate x1, acceleration is started from run-up start coordinate x1 at predetermined acceleration a1, as illustrated in FIG. 5C. When predetermined speed v2 is reached at coordinate x3, pattern drawing is resumed, after which drawing is performed at constant speed v2. FIG. 5D indicates a relationship between coordinates and speeds during drawing.

As described above, in this embodiment, if a drawing pattern is positioned at the end of the mask 150 on the start point side (run-up start side) and run-up distance L1 cannot be thereby assured, in a small area (between coordinates x2 and x3) on the start point side in the drawing area, drawing is performed at speed v1, which is lower than speed v2. Coordinate x3 is determined from run-up start coordinate x1 and run-up distance L1. After low-speed drawing at speed v1, acceleration is started again from run-up start coordinate x1 at acceleration a1, enabling predetermined speed v2 to be reached at coordinate x3 and drawing to be performed at speed v2 at coordinate x3 and later. Accordingly, a limit error can be avoided. It is also possible to suppress a drop in throughput when compared with a case in which drawing is performed at speed v1 over the entire stripe.

Figure 6A:
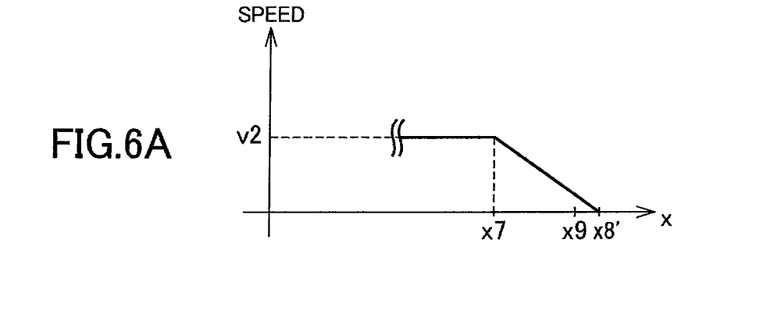
FIG. 6A is a graph illustrating an example in which stop distance is insufficient.

If a drawing pattern is positioned at the end of the mask 150 on the end point side (deceleration start side), stop coordinate x8' may exceed limit coordinate x9 (limit point predetermined according to the structure of the XY stage 140 and the like), as illustrated in FIG. 6A. That is, if drawing termination coordinate x7 is close to limit coordinate x9, there may be a case in which stop distance L2 needed to stop cannot be obtained.

Figure 6B:
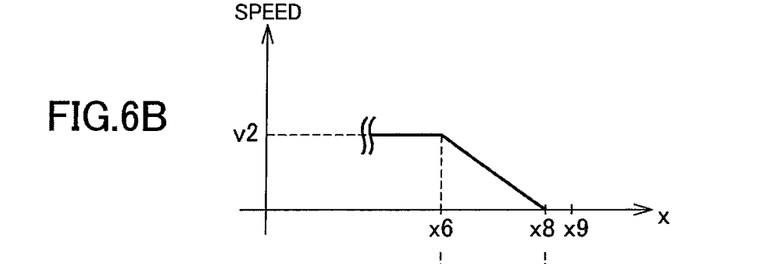
FIGS. 6B, 6C, and 6D are graphs illustrating drawing speed control according to the embodiment.
Figure 6C:
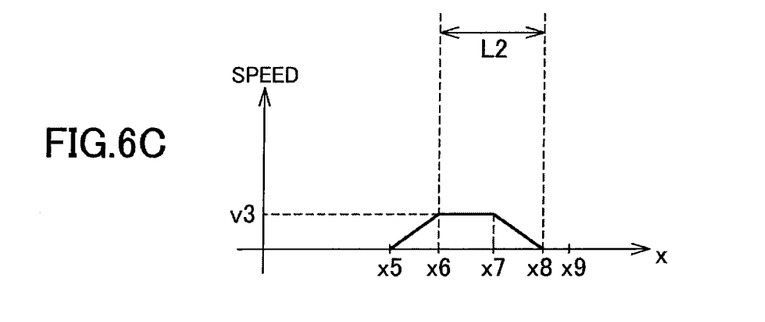
Figure 6D:
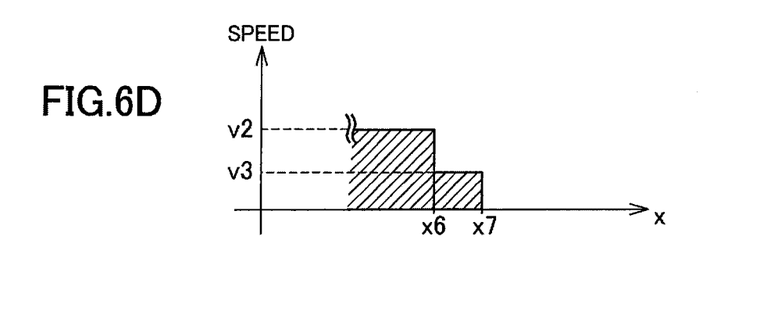

In this case, in this embodiment, pattern drawing is first temporarily stopped at coordinate x6, which is closer to the start point than drawing termination coordinate x7, and stage movement is decelerated at predetermined acceleration a2 and is stopped at stop coordinate x8, at which limit coordinate x9 is not exceeded, as illustrated in FIG. 6B. Then, returning from stop coordinate x8 to coordinate x5, acceleration is started from coordinate x5 at predetermined acceleration a1, as illustrated in FIG. 6C. At coordinate x6, pattern drawing is resumed at speed v3, which is lower than predetermined speed v2. After that, drawing is performed at constant speed v3. When the drawing of the last pattern in this stripe is terminated at drawing termination coordinate x7, deceleration is performed at predetermined acceleration a2 and stage movement is stopped at stop coordinate x8. FIG. 6D illustrates a relationship between coordinates and speeds during drawing.

The distance between coordinate x6 and stop coordinate x8 is almost the same as stop distance L2. Speed v3 is determined from drawing termination coordinate x7, stop coordinate x8, and acceleration a2. That is, speed v3 is about a speed that is such that, after the drawing of the last pattern in this stripe is terminated at drawing termination coordinate x7, deceleration can be performed at predetermined acceleration a2 and stage movement can be stopped at stop coordinate x8. Coordinate x5 is determined from coordinate x6, speed v3, and acceleration a1. That is, coordinate x5 is a position that is such that acceleration can be started at acceleration a1 and speed v3 can be reached at coordinate x6.

As described above, in this embodiment, if a drawing pattern is positioned at the end of the mask 150 on the end point side (deceleration start side) and stop distance L2 cannot be thereby assured, in a small area (between coordinates x6 and x7) on the end point side in the drawing area, drawing is performed at speed v3, which is lower than speed v2. Drawing at predetermined speed v2 is stopped at coordinate x6 so that stage movement can be stopped at stop coordinate x8; in an area between coordinates x6 and x7, low-speed drawing is performed at speed v3. Accordingly, a limit error can be avoided. It is also possible to suppress a drop in throughput when compared with a case in which drawing is performed at speed v3 over the entire stripe.

Next, the control unit 200, which controls entire drawing operation by the drawing unit 100 and executes drawing processing as described above, will be described. The control unit 200 has a storage device 202, a control calculator 210, a polarization control unit 220, and a stage control unit 230.

The storage device 202 is, for example, a magnetic disk device. Drawing data is stored in the storage device 202. The shapes and positions of graphic patterns are defined in this drawing data. The control calculator 210 includes a shot data creating unit 212, a drawing time calculating unit 214, a speed calculating unit 216, and a drawing control unit 218. In the control calculator 210, processing by these units is executed. Inputs and outputs in the control calculator 210 or calculated data is stored in a memory 219.

The control calculator 210 reads out drawing data for one stripe from the storage device 202. The shot data creating unit 212 creates shot data, which is obtained by dividing a graphic pattern defined in the drawing data into shots. The shot data is given to the polarization control unit 220.

The drawing time calculating unit 214 calculates drawing time taken for drawing in each block, which is one of a plurality of blocks into which the stripe is divided along a drawing direction, in consideration of shot data illumination time, amplifier settling time, an actual shot cycle of the polarization control unit 220, and the like. The speed calculating unit 216 calculates predetermined speed v2 from drawing time for a block for which the longest drawing time is taken and the length of the block.

Figure 7A:
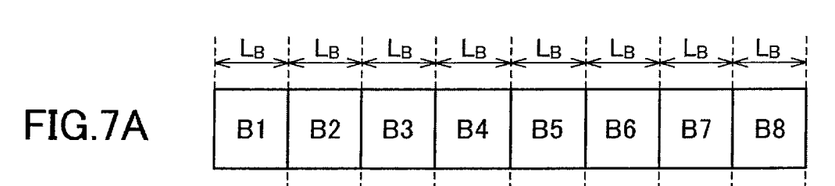
FIG. 7A is a drawing illustrating an example a stripe that has been divided into blocks.
Figure 7B:
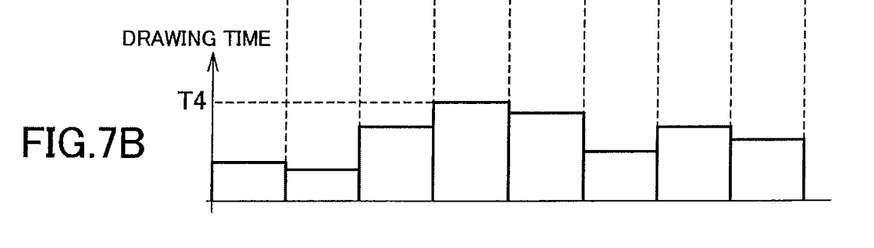
FIG. 7B is a drawing illustrating an example of drawing time in each block.

For example, the drawing time calculating unit 214 divides a stripe into blocks B1 to B8 by length $L_B$ along the drawing direction, as illustrated in FIG. 7A, and calculates drawing time for each block. FIG. 7B indicates drawing time, in each block, calculated by the drawing time calculating unit 214. Drawing time (T4) in block B4 is the longest and speed v2 is obtained by $v2 = L_B/T4$.

The speed calculating unit 216 also decides whether run-up distance L1 can be assured and whether stop distance L2 can be assured. A drawing mode is determined according to the decision result. Drawing modes and their corresponding decision results are as follows.

TABLE 1

| Drawing mode | Decision result |
| --- | --- |
| Normal drawing | Both run-up distance L1 and stop distance L2 can be assured. |
| Start-point-side low-speed drawing | Run-up distance L1 cannot be assured but stop distance L2 can be assured. |
| End-point-side low-speed drawing | Run-up distance L1 can be assured but stop distance L2 cannot be assured. |
| Start-point-side-and-end-point-side low-speed drawing | Neither run-up distance L1 nor stop distance L2 can be assured. |

Normal drawing is a mode in which drawing is performed in the entire area of a stripe at speed v2, as illustrated in FIG. 3. Start-point-side low-speed drawing is a mode in which low-speed drawing is performed in a small area on the start point side at speed v1 and drawing is performed in a subsequent area at speed v2, as illustrated in FIGS. 5B and 5C. End-point-side low-speed drawing is a mode in which low-speed drawing is performed in a small area on the end point side at speed v3 and drawing is performed in an area before the small area at speed v2, as illustrated in FIGS. 6B and 6C. Start-point-side-and-end-point-side low-speed drawing is a mode in which low-speed drawing is performed in a small area on the start point side at speed v1 and in a small area on the end point side at speed v3 and drawing is performed in an area therebetween at speed v2.

When low-speed drawing (start-point-side low-speed drawing, end-point-side low-speed drawing, or start-point-side-and-end-point-side low-speed drawing) is performed, the speed calculating unit 216 obtains positions at which drawing speed is changed, that is, a position at which drawing at low speed v1 is stopped and drawing at speed v2 is resumed (coordinate x3, see FIGS. 5B, 5C, and 5D), a position at which drawing at speed v2 is stopped and drawing at low speed v3 is resumed (coordinate x6, see FIGS. 6B, 6C, and 6D), and the like.

Figure 8:
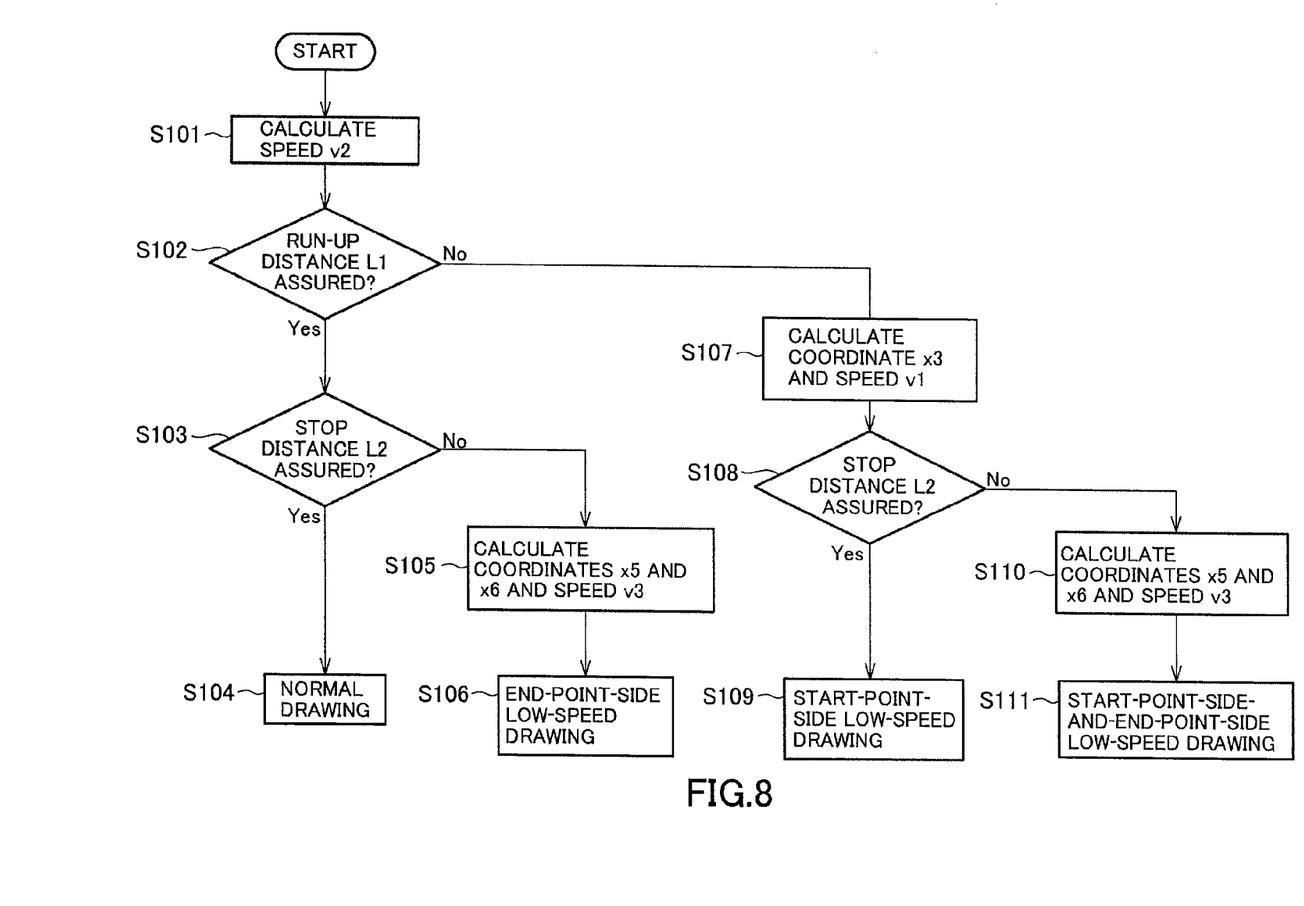
FIG. 8 is a flowchart illustrating processing by a speed calculating unit.

Processing by the speed calculating unit 216 will be described by using the flowchart illustrated in FIG. 8.

(Step S101) Drawing time in each block, which is one of a plurality of blocks into which a stripe is divided, is calculated, and speed v2 is calculated from the longest drawing time and its block length.

(Step S102) Run-up distance L1 is obtained by using equation 1 below.

$$L1 = (1/2) \times (v2)^2 \times a1 + L\text{win} + S\text{post} + A\text{prch} \quad \text{(Eq. 1)}$$

where Lwin is a main polarization window width, which is an offset to prevent a beam polarization range from being entered before drawing speed is reached and thereby a shot from being started. Spost is an offset with stage positioning error taken into consideration. Aprch is an offset needed until speed is settled in a stage system in which movement speed causes an overshoot.

Whether run-up distance L1 obtained as described above can be assured is decided. That is, drawing start coordinate x2 is obtained from drawing data and it is decided whether the run-up start coordinate obtained from drawing start coordinate x2 and run-up distance L1 exceeds limit coordinate x0. If run-up distance L1 can be assured (the run-up start coordinate does not exceed limit coordinate x0), the process proceeds to step S103. If run-up distance L1 cannot be assured, the process proceeds to step S107.

(Step S103) Stop distance L2 is obtained by using equation 2 below.

$$L2=(1/2)\times(v2)^2 \times a2 + L\text{win} + S\text{post} \quad \text{(Eq. 2)}$$

Lwin and Spost are the same as the offsets described for equation 1 above.

Whether stop distance L2 obtained as described above can be assured is decided. That is, drawing termination coordinate x7 is obtained from the drawing data and it is decided whether the stop coordinate obtained from drawing termination coordinate x7 and stop distance L2 exceeds limit coordinate x9. If stop distance L2 can be assured (the stop coordinate does not exceed limit coordinate x9), the process proceeds to step S104. If stop distance L2 cannot be assured, the process proceeds to step S105.

(Step S104) Since both run-up distance L1 and stop distance L2 can be assured, the drawing mode is normal drawing. In normal drawing, constant-speed drawing is performed at speed v2 over the entire area of the stripe.

(Step S105) Coordinate x6 at which drawing at speed v2 is stopped is obtained. Coordinate x6 is equivalent to a position to which stage movement is returned from desired stop coordinate x8 that does not exceed limit coordinate x9 by stop distance L2 calculated by using equation 2.

Drawing speed v3 in an area between coordinates x6 and x7 is further obtained. If the interval between coordinates x7 and x8 is denoted L3, speed v3 is obtained by $v3=(2\times L3 \times a2)^{1/2}$. If drawing at speed v3 is terminated at coordinate x7 and deceleration is performed at acceleration a2, stage movement can be stopped at coordinate x8.

Coordinate x5 is further obtained by using acceleration a1, coordinate x6, and speed v3. Specifically, coordinate x5 is obtained so that acceleration is started from coordinate x5 at acceleration a1 and speed v3 is reached at coordinate x6.

(Step S106) Since run-up distance L1 can be assured but stop distance L2 cannot be assured, drawing mode is end-point-side low-speed drawing.

(Step S107) Coordinate x3 at which drawing at speed v2 is started is obtained. Coordinate x3 is equivalent to a position to which stage movement is advanced from desired run-up start coordinate x1 that does not exceed limit coordinate x0 by run-up distance L1 calculated by using equation 1.

Drawing speed v1 in an area between coordinates x2 and x3 is further obtained. If the interval between coordinates x1 and x2 is denoted L4, speed v1 is obtained by $v1=(2\times L4 \times a1)^{1/2}$.

(Step S108) Whether stop distance L2 can be assured is decided as in step S103. If stop distance L2 can be assured, the process proceeds to step S109. If stop distance L2 cannot be assured, the process proceeds to step S110.

(Step S109) Since run-up distance L1 cannot be assured but stop distance L2 can be assured, drawing mode is start-point-side low-speed drawing.

(Step S110) Coordinates x5 and x6 and speed v3 are obtained as in step S105.

(Step S111) Since neither run-up distance L1 nor stop distance L2 can be assured, drawing mode is start-point-side-and-end-point-side low-speed drawing.

As described above, the speed calculating unit 216 decides whether run-up distance L1 and stop distance L2 can be assured and determines according to a decision result whether to perform low-speed drawing on the start point side and/or end point side. If low-speed drawing is performed, the speed calculating unit 216 calculates the positions (range) of a low-speed drawing area in which low-speed drawing is performed and drawing speeds v1 and v3.

The drawing control unit 218 gives a shot start command to the polarization control unit 220 and notifies it of a short stop coordinate, according to the coordinates and speeds calculated by the speed calculating unit 216. The drawing control unit 218 also gives a stage movement command to the stage control unit 230.

The polarization control unit 220 creates a polarization signal that controls the polarizers 130, 132, and 134, based on the shot data and the command from the drawing control unit 218. The polarization signal is D/A converted and is then amplified by a DAC amplifier (not illustrated), after which the polarization signal is applied to the electrodes of the polarizers 130, 132, and 134. Thus, it is possible to direct an electron beam in a desired shape to a desired position on the mask 150 in desired illumination time (amount of illumination). When low-speed drawing is performed, the drawing can be terminated at a set coordinate. Upon the termination of the drawing, the polarization control unit 220 outputs a stage stop command to the stage control unit 230 and notifies the drawing control unit 218 that the drawing has been terminated.

The stage control unit 230 controls the movement speed of the stage 140 according to the command from the drawing control unit 218. The stage control unit 230 also moves the stage 140 to the coordinate commanded by the drawing control unit 218. The stage control unit 230 also stops the movement of the stage according to the command from the polarization control unit 220, and notifies the drawing control unit 218 that the stage movement has been terminated.

Next, drawing control by the control unit 200 in each drawing mode will be described. First, normal drawing will be described by using the flowchart illustrated in FIG. 9.

Figure 9:
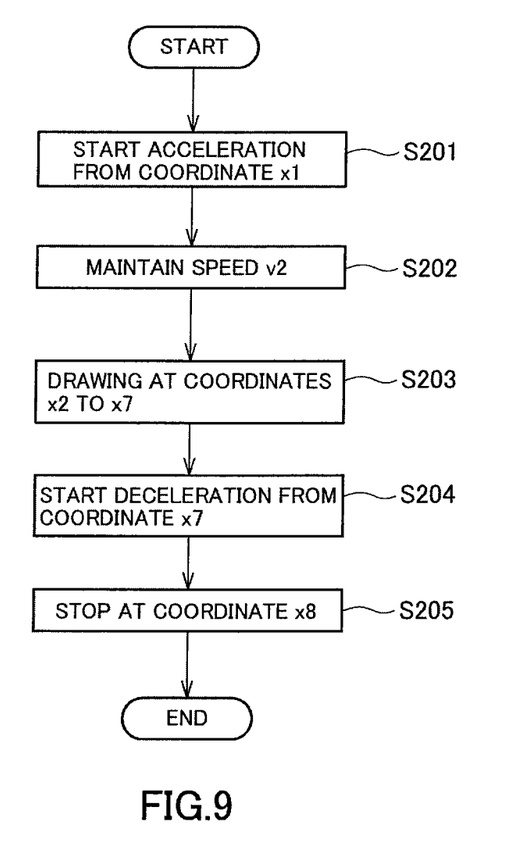
FIG. 9 is a flowchart illustrating a drawing method in normal drawing.

(Step S201) The drawing control unit 218 outputs a shot command to the polarization control unit 220 to place it in a stage waiting state, after which the drawing control unit 218 outputs a stage movement start command to the stage control unit 230. The stage control unit 230 accelerates the stage 140 at acceleration a1, starting from run-up start coordinate x1.

(Step S202) When the stage speed reaches v2, the stage control unit 230 maintains the speed v2.

(Step S203) The polarization control unit 220 controls the polarizers 130, 132, and 134 and draws a pattern in an area, on the mask 150, from drawing start coordinate x2 to drawing termination coordinate x7.

(Step S204) Upon the termination of the pattern drawing up to coordinate x7, the polarization control unit 220 notifies the drawing control unit 218 that the drawing has been terminated and outputs a stage stop command to the stage control unit 230. The stage control unit 230 starts deceleration at acceleration a2 according to the stage stop command.

(Step S205) The stage 140 stops at stop coordinate x8, which does not exceed limit coordinate x9. The stage control unit 230 notifies the drawing control unit 218 that the stage has been stopped. Drawing in one stripe is terminated, and the process proceeds to drawing in a next stripe.

As described above, in normal drawing, constant-speed drawing at speed v2 is performed in the entire area (from drawing start coordinate x2 to drawing termination coordinate x7) of the stripe.

Figure 10:
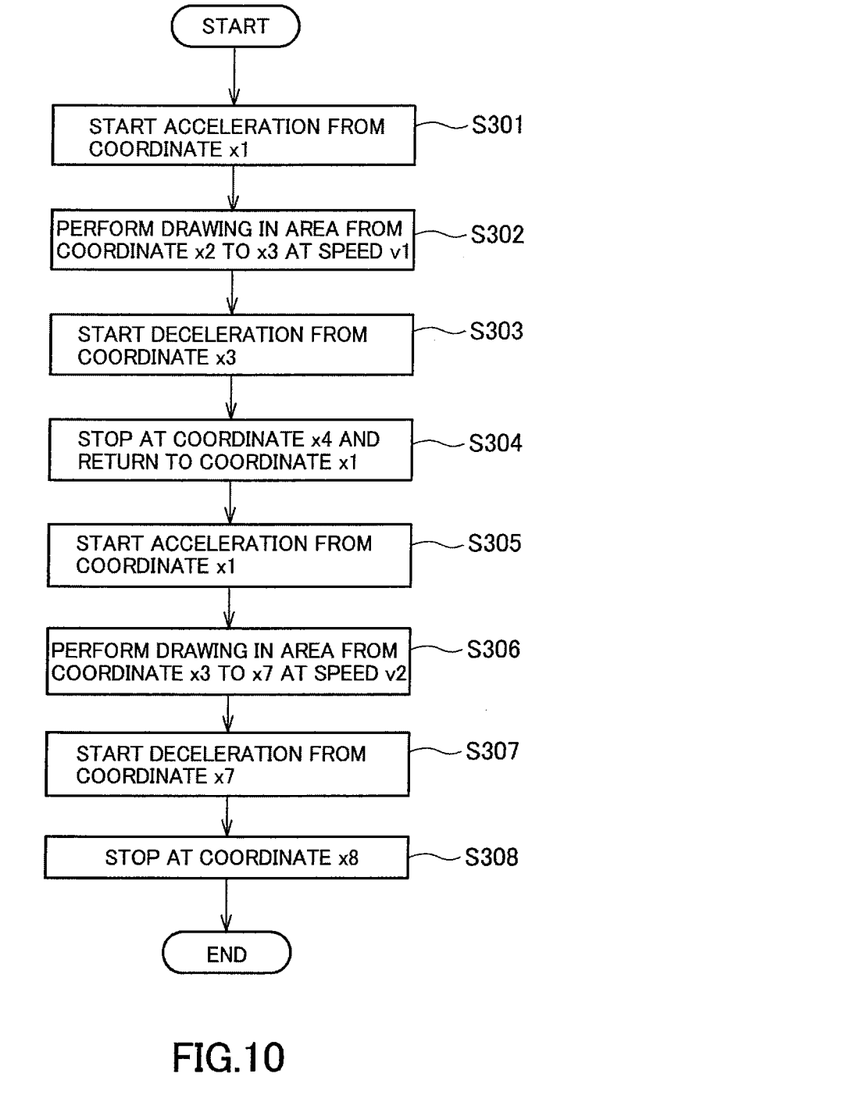
FIG. 10 is a flowchart illustrating a drawing method in start-point-side low-speed drawing.

Next, start-point-side low-speed drawing will be described by using the flowchart illustrated in FIG. 10.

(Step S301) The drawing control unit 218 outputs a shot command to the polarization control unit 220 to place it in the stage waiting state, after which the drawing control unit

218 outputs a stage movement start command to the stage control unit 230. The stage control unit 230 accelerates the stage 140 at acceleration a1, starting from run-up start coordinate x1.

(Step S302) When the stage speed reaches v1, the stage control unit 230 maintains the speed v1. The polarization control unit 220 controls the polarizers 130, 132, and 134 and draws a pattern in an area, on the mask 150, from drawing start coordinate x2 to coordinate x3 at speed v1. Speed v1 and coordinate x3 are the same as calculated in step S107 in FIG. 8.

(Step S303) Upon the termination of the pattern drawing up to coordinate x3, the polarization control unit 220 temporarily terminates the drawing, outputs a stage stop command to the stage control unit 230, and notifies the drawing control unit 218 that the drawing has been terminated. The stage control unit 230 starts deceleration at acceleration a2 according to the stage stop command.

(Step S304) When the stage 140 stops at coordinate x4, the drawing control unit 218 outputs, to the stage control unit 230, a command to move to run-up start coordinate x1. The stage control unit 230 returns the stage 140 to run-up start coordinate x1 and notifies the drawing control unit 218 that the stage movement has been completed.

(Step S305) The drawing control unit 218 outputs a shot command to the polarization control unit 220 to place it in the stage waiting state, after which the drawing control unit 218 outputs a stage movement start command to the stage control unit 230. The stage control unit 230 accelerates the stage 140 at acceleration a1, starting from run-up start coordinate x1.

(Step S306) When the stage speed reaches v2, the stage control unit 230 maintains the speed v2. The polarization control unit 220 controls the polarizers 130, 132, and 134 and draws a pattern in an area, on the mask 150, from coordinate x3 to drawing termination coordinate x7 at speed v2.

(Step S307) Upon the termination of the pattern drawing up to coordinate x7, the polarization control unit 220 notifies the drawing control unit 218 that the drawing has been terminated and outputs a stage stop command to the stage control unit 230. The stage control unit 230 starts deceleration at acceleration a2 according to the stage stop command.

(Step S308) The stage 140 stops at stop coordinate x8, which does not exceed limit coordinate x9. The stage control unit 230 notifies the drawing control unit 218 that the stage has been stopped. Drawing in one stripe is terminated, and the process proceeds to drawing in a next stripe.

Next, end-point-side low-speed drawing will be described by using the flowchart illustrated in FIG. 11.

(Step S401) The drawing control unit 218 outputs a shot command to the polarization control unit 220 to place it in the stage waiting state, after which the drawing control unit 218 outputs a stage movement start command to the stage control unit 230. The stage control unit 230 accelerates the stage 140 at acceleration a1, starting from run-up start coordinate x1.

(Step S402) When the stage speed reaches v2, the stage control unit 230 maintains the speed v2.

(Step S403) The polarization control unit 220 controls the polarizers 130, 132, and 134 and draws a pattern in an area, on the mask 150, from drawing start coordinate x2 to coordinate x6. Coordinate x6 is the same as calculated in step S105 in FIG. 8.

(Step S404) Upon the termination of the pattern drawing up to coordinate x6, the polarization control unit 220 temporarily terminates the drawing, outputs a stage stop command to the stage control unit 230, and notifies the drawing control unit 218 that the drawing has been terminated. The stage control unit 230 starts deceleration at acceleration a2 according to the stage stop command.

(Step S405) When the stage 140 stops at stop coordinate x8, which does not exceed limit coordinate x9, the drawing control unit 218 outputs, to the stage control unit 230, a command to move to run-up start coordinate x5. The stage control unit 230 returns the stage 140 to coordinate x5. Coordinate x5 is the same as calculated in step S105 in FIG. 8.

(Step S406) The drawing control unit 218 outputs a shot command to the polarization control unit 220 to place it in the stage waiting state, after which the drawing control unit 218 outputs a stage movement start command to the stage control unit 230. The stage control unit 230 accelerates the stage 140 at acceleration a1, starting from coordinate x5.

(Step S407) When the stage speed reaches v3, the stage control unit 230 maintains the speed v3. The polarization control unit 220 controls the polarizers 130, 132, and 134 and draws a pattern in an area, on the mask 150, from coordinate x6 to drawing termination coordinate x7 at speed v3. Speed v3 is the same as calculated in step S105 in FIG. 8.

(Step S408) Upon the termination of the pattern drawing up to coordinate x7, the polarization control unit 220 outputs a stage stop command to the stage control unit 230. The stage control unit 230 starts deceleration at acceleration a2 according to the stage stop command.

(Step S409) The stage 140 stops at stop coordinate x8, which does not exceed limit coordinate x9. The stage control unit 230 notifies the drawing control unit 218 that the stage has been stopped. Drawing in one stripe is terminated, and the process proceeds to drawing in a next stripe.

Figure 12:
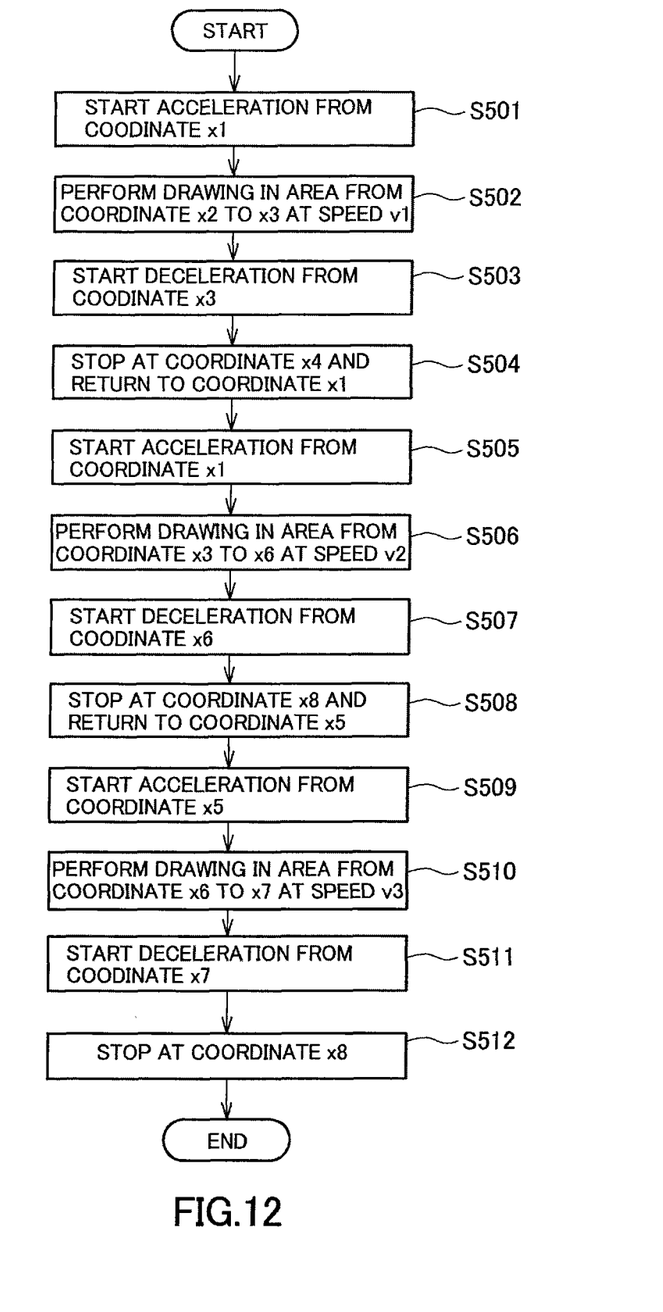
FIG. 12 is a flowchart illustrating a drawing method in start-point-side-and-end-point-side low-speed drawing.

Next, start-point-side-and-end-point-side low-speed drawing will be described by using the flowchart illustrated in FIG. 12. Steps S501 to S505 are the same as steps S301 to S305 in FIG. 10.

(Step S506) When the stage speed reaches v2, the stage control unit 230 maintains the speed v2. The polarization control unit 220 draws a pattern in an area, on the mask 150, from coordinate x3 to coordinate x6 at speed v2.

Figure 11:
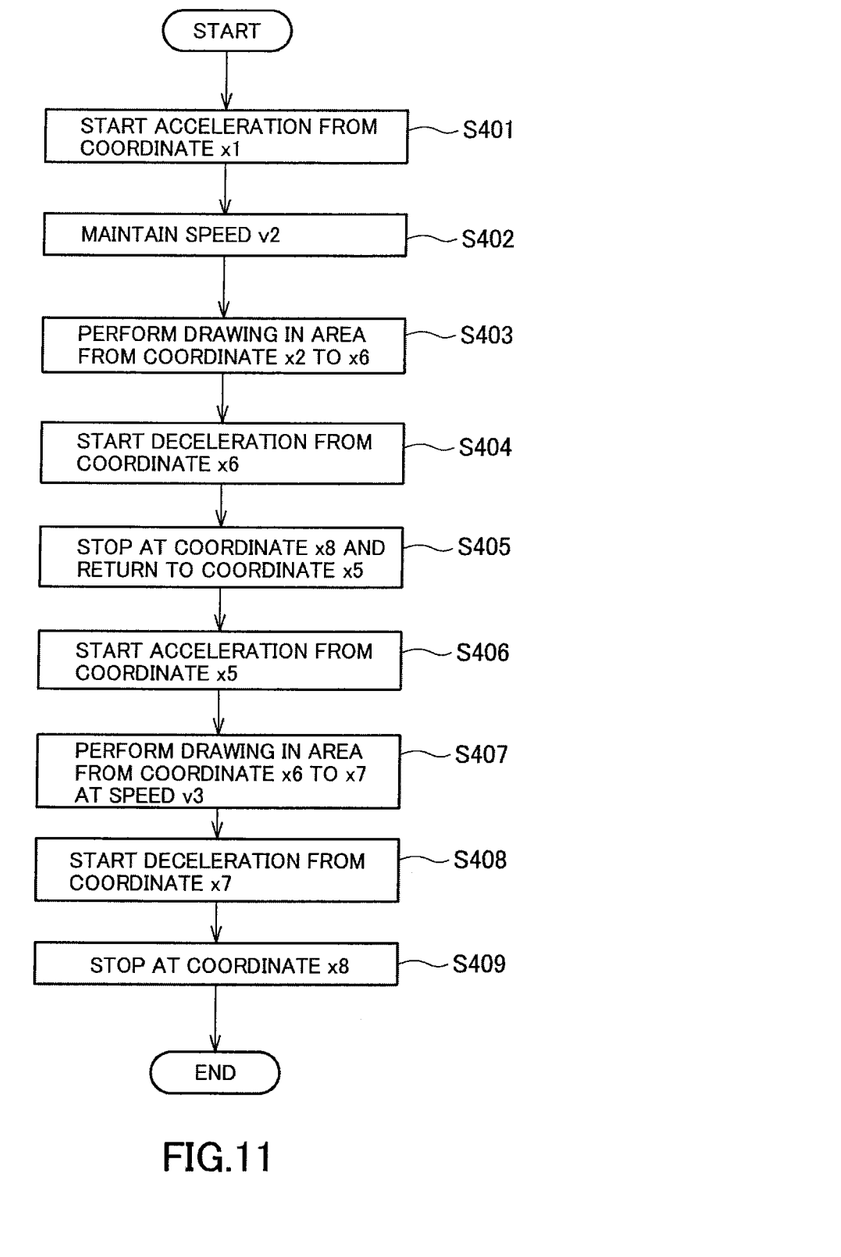
FIG. 11 is a flowchart illustrating a drawing method in end-point-side low-speed drawing.

Subsequent steps S507 to S512 are the same as steps S404 to S409 in FIG. 11.

As described above, in this embodiment, if run-up distance L1 needed to start drawing at speed v2 cannot be assured, in a first area (between coordinates x2 and x3) on the start point side in the drawing area, drawing is performed at speed v1, which is lower than speed v2. After drawing has been performed in the first area, a return to run-up start coordinate x1 is made, acceleration is started, and in a second area at coordinate x3 and later, drawing is performed at speed v2. Thus, a limit error can be avoided. It is also possible to suppress a drop in throughput when compared with a case in which drawing is performed at speed v1 over the entire stripe.

If stop distance L2 cannot be assured, in a third area (between coordinates x6 and x7) on the end point side in the drawing area, drawing is performed at speed v3, which is lower than speed v2. After drawing has been performed in the second area up to coordinate x6 at speed v2, the drawing is temporarily terminated and the stage 140 is stopped at a position that does not exceed the limit coordinate. Then, the stage 140 is returned to coordinate x5, after which acceleration is started and, in the third area, low-speed drawing is performed at speed v3 so that the stage 140 can be stopped at a position that does not exceed the limit coordinate. Thus, a limit error can be avoided on the stop side. It is also possible to suppress a drop in throughput when compared with a case in which drawing is performed at speed v3 over the entire stripe.

As described above, according to this embodiment, a limit error can be avoided. By limiting a range in which stage speed is lowered (low-speed drawing is performed), a drop in throughput can be suppressed.

In the embodiment described above, when run-up distance L1, stop distance L2, the ranges of the low-speed drawing areas (first area from coordinate x2 to x3 and third area from coordinate x6 to x7), and the like are calculated, it is desirable to consider error (offsets) of various mechanisms of the drawing apparatus.

In the embodiment described above, it may be determined before drawing processing for a stripe is started whether stop distance L2 can be assured, that is, whether to perform, in the third area (between coordinates x6 and x7) on the end point side in the drawing area, low-speed drawing at speed v3, which is lower than speed v2. Alternatively, this may be determined during drawing processing.

The XY stage 140 may be driven by friction. Alternatively, the XY stage 140 may be an air stage in which an air bearing (static pressure air bearing) is used to expel pressurized air to a guide and lift a table due to generated static pressure. Since an air stage is likely to cause an overshoot when a speed is changed, it is desirable to perform constant-speed drawing, in which there is no speed change during drawing.

Although, in the embodiment described above, a stripe has been divided into a plurality of blocks and speed v2 has been determined from drawing time in each block, the user may determine the value of speed v2 in advance.

In the embodiment described above, a drawing apparatus in a single-beam method, in which drawing is performed with one electronic beam, has been described, a drawing apparatus in a multi-beam method may be used. With a drawing apparatus in a multi-beam method, electronic beams emitted from an electron gun are passed through a blanking aperture array having a plurality of apertures and blanking control is performed individually, for example. Each beam that has not been shielded is directed to a desired position on the mask.

At least part of the control calculator 210 described in the above embodiments may be implemented in either hardware or software. When implemented in software, a program that realizes at least part of functions of the control calculator 210 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
   a drawing unit that draws a pattern by directing a charged particle beam to a predetermined position on a target placed on a movable stage; and
   a control unit that includes a control calculator that controls the drawing unit,
   wherein the control calculator comprises
      a speed calculating unit configured to calculate a first drawing speed in a first area in a drawing area on the target based on a run-up start coordinate, a drawing start coordinate, and a predetermined first acceleration, and the speed calculating unit configured to calculate a range of the first area based on the run-up start coordinate, the first acceleration, and a second drawing speed, which is higher than the first drawing speed, and
      a drawing control unit configured to control the drawing unit to perform drawing at the first drawing speed in the first area, and at the second drawing speed in a second area that follows the first area,
   wherein the speed calculating unit calculates a run-up distance based on the first acceleration and the second drawing speed, decides whether the run-up distance is capable of being assured from a limit coordinate on a start point side and the drawing start coordinate, calculates the first drawing speed and the range of the first area, and starts drawing at the first drawing speed if the run-up distance is not capable of being assured and starts drawing at the second drawing speed if the run-up distance is capable of being assured.

2. The charged particle beam drawing apparatus according to claim 1, wherein:
   the speed calculating unit calculates a third drawing speed in a third area that follows the second area based on a stop coordinate, a drawing termination coordinate, and a predetermined second acceleration, and calculates a range of the third area based on the stop coordinate, the second acceleration, and the second drawing speed; and
   the drawing control unit controls the drawing unit to perform drawing at the third drawing speed in the third area.

3. The charged particle beam drawing apparatus according to claim 2, wherein the speed calculating unit calculates a stop distance based on the second acceleration and the second drawing speed, decides whether the stop distance is capable of being assured from a limit coordinate on an end point side and the drawing termination coordinate, and calculates the third drawing speed and the range of the third area if the stop distance is not capable of being assured.

4. The charged particle beam drawing apparatus according to claim 1, further comprising a drawing time calculating unit configured to divide the drawing area into stripes, to divide each of the stripes into blocks respectively, to calculate each of a drawing time taken for drawing in each block, and to calculate the second drawing speed by dividing a length of one of the blocks in a drawing direction by the longest drawing time of the blocks.

5. The charged particle beam drawing apparatus according to claim 1, wherein the stage is an air stage.

6. The charged particle beam drawing apparatus according to claim 1, wherein the first area is smaller than the second area.

7. The charged particle beam drawing apparatus according to claim 2, wherein the third area is smaller than the second area.

8. A charged particle beam drawing method comprising:
calculating a first drawing speed in a first area in a drawing area on a target placed on a stage based on a run-up start coordinate, a drawing start coordinate, and a predetermined first acceleration;
calculating a range of the first area based on the run-up start coordinate, the first acceleration, and a second drawing speed, which is higher than the first drawing speed;
accelerating the stage from the run-up start coordinate at the first acceleration and, in the first area, performing drawing at the first drawing speed;
stopping the stage after the drawing in the first area;
returning the stage to the run-up start coordinate;
accelerating the stage from the run-up start coordinate at the first acceleration;
drawing at the second drawing speed in a second area that follows the first area;
calculating a run-up distance based on the first acceleration and the second drawing speed; and
deciding whether the run-up distance is capable of being assured from a limit coordinate on a start point side and the drawing start coordinate,
wherein the first drawing speed and the range of the first area are calculated and drawing is started at the first drawing speed if the run-up distance is not capable of being assured, and
wherein drawing is started at the second drawing speed if the run-up distance is capable of being assured.

9. The charged particle beam drawing method according to claim 8, further comprising:
calculating a third drawing speed in a third area that follows the second area based on a stop coordinate, a drawing termination coordinate, and a predetermined second acceleration;
calculating a range of the third area based on the stop coordinate, the second acceleration, and the second drawing speed;
stopping the stage at the stop coordinate after the drawing in the second area;
returning the stage;
accelerating the stage at the first acceleration; and
drawing at the third drawing speed in the third area.

10. The charged particle beam drawing method according to claim 9, further comprising:
calculating a stop distance based on the second acceleration and the second drawing speed; and
deciding whether the stop distance is capable of being assured from a limit coordinate on an end point side and the drawing termination coordinate, wherein
the third drawing speed and the range of the third area are calculated if the stop distance is not capable of being assured.

11. The charged particle beam drawing method according to claim 8, wherein the second drawing speed is calculated by dividing the drawing area into stripes, dividing each of the stripes into blocks, calculating each drawing time taken for drawing in each of the blocks, and dividing a length of one of the blocks in a drawing direction by the longest drawing time of the blocks.

12. The charged particle beam drawing method according to claim 8, wherein the stage is an air stage.

13. The charged particle beam drawing method according to claim 8, wherein the first area is smaller than the second area.

14. The charged particle beam drawing method according to claim 9, wherein the third area is smaller than the second area.

* * * * *